US00RE50010E

(19) United States
(12) Reissued Patent
Kim et al.

(10) Patent Number: US RE50,010 E
(45) Date of Reissued Patent: Jun. 11, 2024

(54) CLOCK GATING CIRCUIT

(71) Applicant: SAMSUNG ELECTRONICS CO., LTD., Suwon-si (KR)

(72) Inventors: Ah-Reum Kim, Daegu (KR); Hyun Lee, Incheon (KR); Min-su Kim, Hwaseong-si (KR)

(73) Assignee: SAMSUNG ELECTRONICS CO., LTD., Suwon-si (KR)

(21) Appl. No.: 17/672,371

(22) Filed: Feb. 15, 2022

Related U.S. Patent Documents

Reissue of:
(64) Patent No.: 10,566,977
Issued: Feb. 18, 2020
Appl. No.: 16/259,631
Filed: Jan. 28, 2019

U.S. Applications:
(62) Division of application No. 15/139,949, filed on Apr. 27, 2016, now Pat. No. 10,230,373.

(30) Foreign Application Priority Data

Apr. 27, 2015 (KR) ..... 10-2015-0058762
Oct. 2, 2015 (KR) ..... 10-2015-0139061

(51) Int. Cl.
*H03K 3/356* (2006.01)
*H03K 3/012* (2006.01)
(Continued)

(52) U.S. Cl.
CPC ..... *H03K 19/01855* (2013.01); *H03K 3/012* (2013.01); *H03K 3/037* (2013.01);
(Continued)

(58) Field of Classification Search
CPC ..... H03K 3/02; H03K 3/012; H03K 3/037; H03K 3/356; H03K 3/356104;
(Continued)

(56) References Cited

U.S. PATENT DOCUMENTS 6,204,695 B1 3/2001 Alfke et al.
7,116,150 B2 10/2006 Francom
(Continued)

FOREIGN PATENT DOCUMENTS

JP 2015-12424 A 1/2015
KR 10-0358135 B1 10/2002

OTHER PUBLICATIONS

Communication dated Jul. 7, 2022, issued by the Korean Intellectual Property Office in Korean Patent Application No. 10-2015-0139061.

*Primary Examiner* — My Trang Ton
(74) *Attorney, Agent, or Firm* — Sughrue Mion, PLLC

(57) ABSTRACT

Provided are semiconductor circuits. A semiconductor circuit includes a first circuit configured to propagate a value of a first node to a second node based on a voltage level of a clock signal; a second circuit configured to propagate a value of the second node to a third node based on the voltage level of the clock signal; and a third circuit configured to determine a value of the third node based on a voltage level of the second node and the voltage level of the clock signal, wherein the first circuit comprises a first transistor gated to a voltage level of the first node, a second transistor connected in series with the first transistor and gated to the voltage level of the third node, and a third transistor connected in parallel with the first and second transistors and gated to a voltage level of the clock signal to provide the value of the first node to the second node.

15 Claims, 13 Drawing Sheets

(51) Int. Cl.
*H03K 3/037* (2006.01)
*H03K 19/00* (2006.01)
*H03K 19/0185* (2006.01)

(52) U.S. Cl.
CPC . *H03K 3/356104* (2013.01); *H03K 3/356191* (2013.01); *H03K 19/0013* (2013.01)

(58) Field of Classification Search
CPC ..... H03K 3/356136; H03K 3/356191; H03K 3/356173; H03K 19/00; H03K 19/0013; H03K 19/0016; H03K 19/0185; H03K 19/01855; H03K 19/0944; H03K 19/0948; H03K 19/096; H03K 19/0963
See application file for complete search history.

(56) References Cited

U.S. PATENT DOCUMENTS 7,129,754 B2 10/2006 Ngo et al.
7,595,665 B2 9/2009 Park et al.
7,639,057 B1 * 12/2009 Su ..... G06F 1/10 326/97
7,902,878 B2 3/2011 Saint-Laurent et al.
8,030,982 B2 10/2011 Datta et al.
8,786,344 B2 7/2014 Salling
8,890,573 B2 11/2014 Elkin et al.
8,975,949 B2 3/2015 Berzins et al.
9,100,016 B2 8/2015 Kim
9,246,489 B1 1/2016 Nandi et al.
9,350,327 B2 5/2016 Nandi et al.
9,362,910 B2 6/2016 Gurumurthy et al.
10,230,373 B2 * 3/2019 Kim ..... H03K 19/01855
2008/0238514 A1 10/2008 Kim
2010/0277219 A1 * 11/2010 Campbell ..... H03K 19/0016 327/434
2012/0268182 A1 10/2012 Lee et al.
2013/0241617 A1 9/2013 Kim
2016/0094204 A1 3/2016 Nandi et al.

* cited by examiner

CLOCK GATING CIRCUIT

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*This is a reissue application of U.S. Pat. No. 10,566,977, which was filed as U.S. patent application Ser. No. 16/259,631 on Jan. 28, 2019 and issued on Feb. 18, 2020, which is a Divisional of U.S. application Ser. No. 15/139,949 filed Apr. 27, 2016, now U.S. Pat. No. 10,230,373, issued on Mar. 12, 2019, which claims priority to Korean Patent Application No. 10-2015-0058762 filed on Apr. 27, 2015 and Korean patent Application No. 10-2015-0139061 filed on Oct. 2, 2015, the disclosures of which are incorporated herein by reference in their entireties.*

CROSS-REFERENCE TO THE RELATED APPLICATIONS

This is a Divisional of U.S. application Ser. No. 15/139,949 filed Apr. 27, 2016, which claims priority from Korean Patent Application No. 10-2015-0058762 filed on Apr. 27, 2015 and Korean Patent Application No. 10-2015-0139061 filed on Oct. 2, 2015 in the Korean Intellectual Property Office, the disclosures of which are incorporated herein in their entirety by reference.

BACKGROUND

1. Field

Apparatuses and methods consistent with exemplary embodiments relate to a semiconductor circuit.

2. Description of the Related Art

In an electronic device, more logic circuits are integrated on a single chip with miniaturization of processes, and power consumption per unit area of a chip is gradually increasing. Therefore, a problem of heat generation has also emerged as an important issue in an electronic device that adopts such a chip.

A clock gate that supplies a clock signal to an operation circuit including a flip-flop is a typical device that consumes the most power in the electronic device. Therefore, it is very important to reduce power consumption of these elements.

SUMMARY

Exemplary embodiments provide a semiconductor circuit with improved product reliability and reduced power consumption.

The aspects of the inventive concept are not restricted to the one set forth herein, and other aspects that have not been mentioned will become more apparent to one of ordinary skill in the art to which the inventive concept pertains by referencing the following detailed description of the inventive concept.

According to an aspect of an exemplary embodiment, there is provided a semiconductor circuit which may include: a first circuit configured to propagate a value of a first node to a second node based on a voltage level of a clock signal; a second circuit configured to propagate a value of a second node to a third node based on the voltage level of the clock signal; and a third circuit configured to determine a value of the third node based on a voltage level of the second node and the voltage level of the clock signal, wherein the first circuit comprises a first transistor gated to a voltage level of the first node, a second transistor connected in series with the first transistor and gated to the voltage level of the third node, and a third transistor connected in parallel with the first and second transistors and gated to the voltage level of the of the clock signal to provide the value of the first node to the second node.

According to another aspect of an exemplary embodiment, there is provided a semiconductor circuit which may include: a first circuit configured to propagate a value of a first node to a second node based on a voltage level of a clock signal; a second circuit configured to propagate a value of the second node to a third node based on the voltage level of the clock signal; and a third control configured to determine a value of the third node based on a voltage level of the second node and the voltage level of the clock signal, wherein the first circuit comprises a first transistor gated to a voltage level of the first node, a second transistor connected in series with the first transistor and gated to a voltage level of the third node, and a third transistor gated to the voltage level of the of the clock signal to provide the value of the first node to the second node, the second circuit comprises an inverter configured to invert the value of the second node, and a fourth transistor gated to the voltage level of the clock signal to transmit an output value of the inverter to the third node, and the third circuit comprises a fifth transistor gated to the voltage level of the second node to provide a power supply voltage to the third node, and a sixth transistor connected in parallel with the fifth transistor and gated to the voltage level of the clock signal to provide the power supply voltage to the third node.

According to still another aspect of an exemplary embodiment, there is provided a semiconductor circuit which may include: a first circuit configured to propagate a value of a first node to a second node based on a voltage level of a clock signal; a second circuit configured to propagate a value of the second node to a third node based on the voltage level of the clock signal; and a third circuit configured to determine a value of the third node based on a voltage level of the second node and the voltage level of the clock signal, wherein the first circuit comprises a first transistor gated to a voltage level of the first node, a second transistor connected in series with the first transistor and gated to a voltage level of the third node, and a third transistor connected in parallel with the first and second transistors and gated to the voltage level of the of the clock signal to provide the value of the first node to the second node, and the second circuit comprises a fourth transistor gated to the voltage level of the clock signal to transmit the value of the second node to the third node.

According to still another aspect of an exemplary embodiment, there is provided a semiconductor circuit which may include: a first circuit configured to propagate a value of a first node to a second node based on a voltage level of a clock signal; a second circuit configured to propagate a value of the second node to a third node based on the voltage level of the clock signal; and a third circuit configured to determine a value of the third node based on a voltage level of the second node and the voltage level of the clock signal, wherein the first circuit comprises a first transistor gated to a voltage level of the first node, a second transistor connected in series with the first transistor and gated to the voltage level of the third node, and a third transistor connected in series with the first transistor or the second transistor and gated to the voltage level of the of the clock signal to provide the value of the first node to the second node, and the first transistor and the second transistor provide the ground voltage to the second node.

According to still another aspect of an exemplary embodiment, there is provided a semiconductor circuit which may include: a first circuit comprising a first transistor configured to propagate the inverted voltage level of the first node to a second node, when a clock signal is at a first voltage level; a second circuit comprising a second transistor configured to propagate the inverted voltage level of the second node to a third node, when the clock signal is at a second voltage level; and a third circuit comprising a third transistor gated to the voltage level of the second node to provide a power supply voltage to the third node.

According to still another aspect of an exemplary embodiment, there is provided a semiconductor circuit which may include: a first clock gate circuit and a second clock gate comprising a first circuit and a second circuit; and a first operation circuit configured to receive a clock signal through the first clock gate circuit, and a second operation circuit configured to receive the clock signal through the second clock gate circuit, wherein the first circuit comprises a first transistor configured to propagate the inverted voltage level of the first node to the second node when the clock signal is at a first voltage level, and a second transistor and a third transistor connected in series with each other and connected in parallel with the first transistor, and wherein the second circuit comprises a fourth transistor configured to propagate the inverted voltage level of the second node to a third node when the clock signal is at the second voltage level.

According to still another aspect of an exemplary embodiment, there is provided a semiconducdtor circuit which may include: an input circuit configured to determine a value of a first node based on an enable signal and a scan enable signal; a first circuit configured to propagate a value of the first node to a second node based on a voltage level of a clock signal and a voltage level of the first node; a second circuit configured to propagate a value of the second node to a third node based on the voltage level of the clock signal; and a third circuit configured to determine a value of the third node based on a voltage level of the second node and the voltage level of the clock signal.

BRIEF DESCRIPTION OF THE DRAWINGS

The above and other aspects and features will become more apparent by describing in detail exemplary embodiments thereof with reference to the attached drawings, in which.

DETAILED DESCRIPTION OF THE EXEMPLARY EMBODIMENTS

Figure 1A:
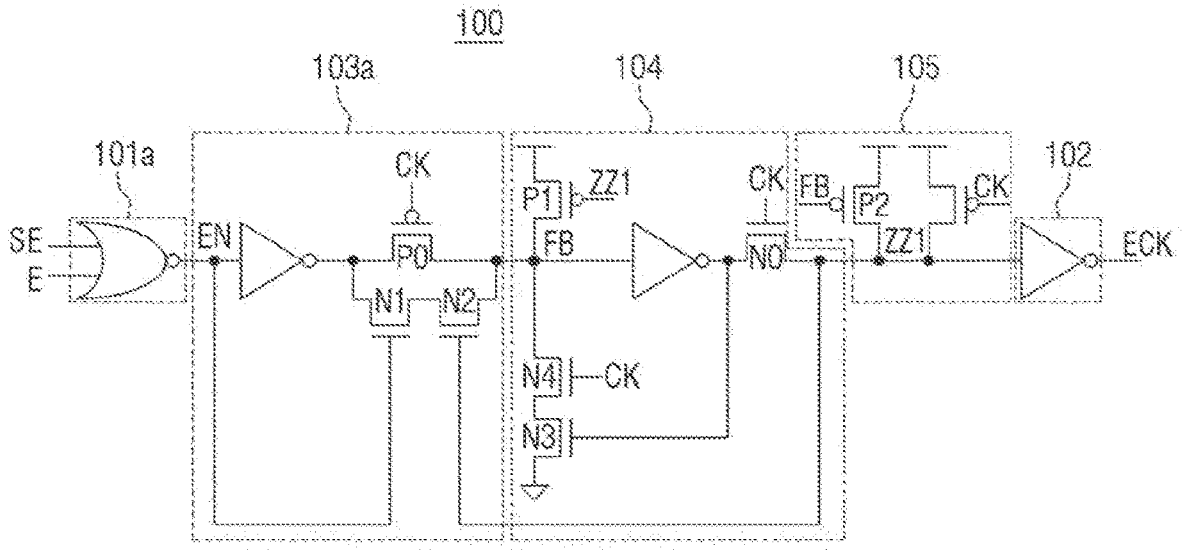
FIG. 1A is a circuit diagram illustrating a semiconductor circuit according to an exemplary embodiment.

Various exemplary embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the scope of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or features's relationship to another element(s) or feature(s) as illustrated in the figures. It will be understood that the spatially relative terms are intended to encompass different orientations of the device in use or operation in addition to the operation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning are commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formed sense unless expressly so defined therein.

Hereinafter, exemplary embodiments will be described with reference to the attached drawings.

FIG. 1A is a circuit diagram illustrating a semiconductor circuit according to an exemplary embodiment.

Referring to FIG. 1A, a semiconductor circuit 100 according to an exemplary embodiment includes an input circuit 101a, a first circuit 103a, a second circuit 104, a third circuit 105 and an output circuit 102.

The input circuit 101a may determine voltage levels of a node EN based on voltage levels of an enable signal E and a scan enable signal SE. In FIG. 1A, although an input circuit 101a is illustrated as a NOR gate in which the enable signal E is set as a first input and the scan enable signal SE is set as a second input, the scope of the inventive concept is not limited thereto. That is, the input circuit 101a may include a circuit which is different from the NOR gate if the circuit is capable of determining the voltage level of the node EN of the first circuit 103a. This principle is similarly applied to other exemplary embodiments to be described below in connection with FIGS. 2 to 12.

Meanwhile, the output circuit 102 may determine a voltage level of a node ECK, based on the voltage level of a node ZZ1. Although the output circuit 102 is illustrated as an inverter that inverts the voltage level of the node ZZ1 in FIG. 1A, the scope of the inventive concept is not limited thereto. that is, the output circuit 102 may include a circuit which is different from the inverter if the circuit is capable of determining the voltage level of the node ECK. This principle is also similarly applied to other exemplary embodiments to be described below in connection with FIGS. 2 to 12. In particular, the output circuit 102 may include a latch circuit for operating a semiconductor circuit according to various exemplary embodiments as a flip-flop, and this will be described later in connection with FIGS. 1B and 1C.

The first circuit 103a may include a transistor N1 that is gated to the voltage level of the node EN, a transistor N2 that is connected in series with the transistor N1 and gated to the voltage level of the node ZZ1, and a transistor P0 that is connected in parallel with the transistors N1, N2 and gated to the voltage level of the clock signal CK. In particular, the transistors N1, N2 are connected in parallel with the transistor P0, and a source of one of the transistors N1, N2 is connected to a node FB. In some exemplary embodiments, the connection sequence of the transistors N1, N2 connected in series with each other may be changed.

The second circuit 104 may include a transistor P1 that is gated to the voltage level of the node ZZ1 to provide a power supply voltage to the node FB, a transistor N3 that is gated to an inverted voltage level of the node FB to provide a ground voltage, and a transistor N4 that is connected in series with the transistor and N3 and gated to a voltage level of a clock signal CK to provide a ground voltage to the node FB. In some exemplary embodiments, the connection sequence of the transistors N3, N4 connected in series with each other may be changed. That is, the transistor N4 may be disposed between a drain of the transistor N3 and the node FB to provide a ground voltage provided by the transistor N3 to the node FB, and may also be disposed between a ground node and a source of the transistor N4 to provide the ground voltage to the transistor N3. In the latter case, the transistor N3 may be disposed between a drain of the transistor N4 and the node FB. Furthermore, the second circuit 104 may include a transistor N0 gated to the voltage level of the clock signal CK.

The third circuit 105 may include a transistor P2 gated to the voltage level of the node FB to provide the power supply voltage to the node ZZ1, and a transistor connected in parallel with the transistor P2 and gated to the voltage level of the clock signal CK to provide the power supply voltage to the node ZZ1.

The operation of the semiconductor circuit 100 will be described as follows.

The first circuit 103a propagates a value of the node EN to the node FB, based on the voltage level of the enable signal E and the voltage level of the clock signal CK. That is, the value of the node EN is propagated to the node FB through the transistors P0, N1, and N2. For example, when the clock signal CK is at a first voltage level (for example, a logic low level, hereinafter, referred to as "L"), the transistors P0, N2 are turned on regardless of the state of the transistor N1. Therefore, the value of the node FB is determined as a value of the node EN that is inverted through an inverter.

In this case, the node ZZ1 has a second voltage level (for example, a logic high level, hereinafter , referred to as "H") by a transistor which is gated to the voltage level of the clock signal CK in the third circuit 105. Therefore, when the clock signal CK is at the first voltage level L, since the node ZZ1 has a second voltage level H, the node ECK has the same first voltage level L as the voltage level of the clock signal CK.

The term "first voltage level" and "second voltage level" are used herein to distinguish two signal levels. Thus, the first voltage level may be a logic high level H while the second voltage level may be a logic low level L. The meaning of an expression "a certain circuit propagates the value of the specific node A to another specific node B" in this specification includes the meaning that the value of another specific node B can be determined depending on the value of the specific node A. Thus, the value of the specific node A does not necessarily need to be the same as the value of the specific node B. For example, in FIG. 1A, the first circuit 103a includes an inverter that inverts the value of the node EN, and the meaning of the expression "the first circuit 103a propagates the value of the node EN to the node FB" includes the meaning of transmission of the value (i.e., /EN) inverted by the inverter to the node FB using the transistors P0, N1, and N2.

The second circuit 104 propagates the value of the node FB to the node ZZ1 based on the voltage level of the clock signal CK. That is, the value of the node FB is propagated to the node ZZ1 through the transistor N0. For example, when the clock signal CK is at the second voltage level H, since the transistor N0 is turned on, the value of the node ZZ1 is determined as the value of the node FB inverted via the inverter.

The third circuit 105 determines the value of the node ZZ1 based on the voltage level of the node FB and the voltage level of the clock signal CK. In particular, when the clock signal CK is transferred from the first voltage level L to the second voltage level H, the transistor P2 is gated to the voltage level of the node FB to provide the power supply voltage to the node ZZ1.

The operation of the semiconductor circuit 100 will be described in more detail. In a case where the node EN is at the first voltage level L, when the clock signal CK is at the first voltage level L, the transistor P0 is turned on and the node FB has the second voltage level H. At this time, the node ZZ1 may receive the power supply voltage by a transistor that is gated to the voltage level of the clock signal CK in the third circuit 105. However, when the clock signal CK is at the second voltage level H, the transistor P0 is turned off and the second voltage level H is maintained at the node FB. At this time, the transistor N0 is turned on, and the second voltage level H of the node FB is inverted and propagated to the node ZZ1.

In other words, in a case where the node EN is at the first voltage level L, that is, in a case where the enable signal E has the second voltage level H, when the clock signal CK is at the first voltage level L, the nodes FB and ZZ1 have the second voltage level H, and thus, the node ECK has the first voltage level L. However, when the clock signal CK is at the second voltage level H, the voltage level of the node FB is maintained as the second voltage level H without change, the node ZZ1 has the first voltage level L, and thus, the node ECK has the second voltage level H. That is, it is possible to understand that, when the enable signal E has the second voltage level H, the node ECK has a value directly corresponding to the value of the clock signal CK.

In a case where the node EN is at the second voltage level H, when the clock signal CK is at the first voltage level L, the transistors N1 and N2 are turned on depending on the conditions of the transistor P0, and the node FB has the first voltage level L. However, when the clock signal CK is at the second voltage level H, the transistor P0 is turned off and the first voltage level L is maintained at the node FB. At this time, the node ZZ1 may receive the power supply voltage by the transistor P2 which is gated to the voltage level of the node FB.

In other words, in a case where the node EN is at the second voltage level H, that is, in a case where the enable signal E has the first voltage level L, when the clock signal CK is at the first voltage level L, the node FB has the first voltage level L, the node ZZ1 has the second voltage level H, and thus, the node ECK has the first voltage level L. However, when the clock signal CK is at the second voltage level H, the voltage level of the node FB is kept at the first voltage level L without change, the node ZZ1 has second voltage level H, and thus, the node ECK has the first voltage level L. That is, it is possible to understand that, when the enable signal E has the first voltage level L, the node ECK has the first voltage level L value, regardless of the value of the clock signal CK.

Figure 1B:
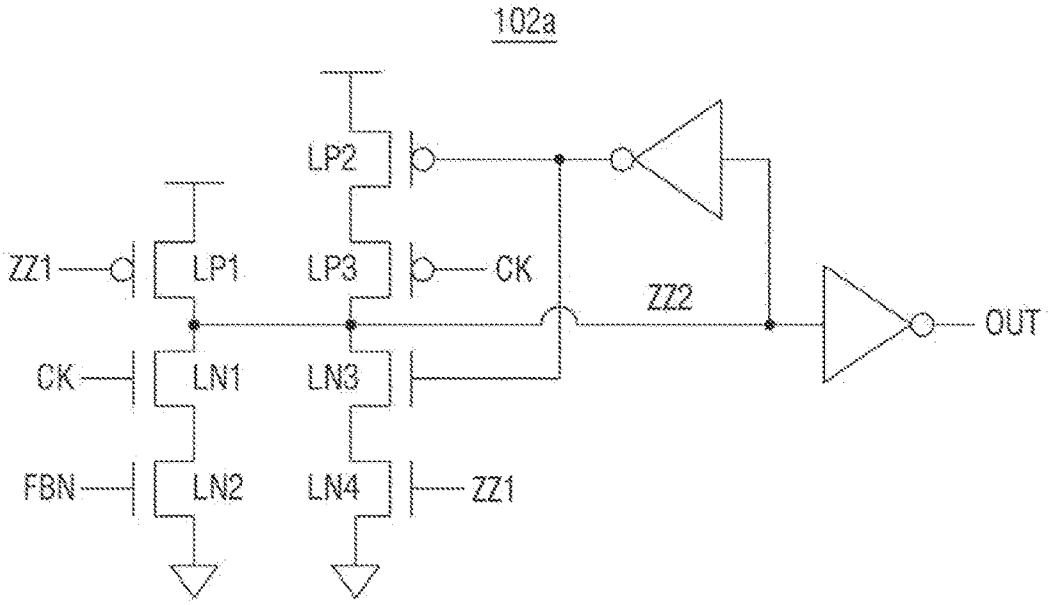
FIG. 1B is a diagram illustrating a modified example of an output circuit of the semiconductor circuit according to an exemplary embodiment.

FIG. 1B illustrates a modified example of the output circuit of the semiconductor circuit according to an exemplary embodiment.

Referring to FIG. 1B, an output circuit 102a may include transistors LP1, LN1, and LN2 connected in series with each other, and transistors LP2, LP3, LN3, and LN4 connected in series with each other.

The transistor LP1 is gated to the voltage level of the node ZZ1 to provide the power supply voltage to the node ZZ2, the transistor LN2 is gated to the inverted voltage level FBN of the node FB to provide the ground voltage, and the transistor LN1 is gated to the voltage level of the clock signal CK to provide the ground voltage to the node ZZ2.

The transistor LP2 is gated to the inverted voltage level of the node ZZ2 to provide the power supply voltage, and the transistor LP3 is gated to the voltage level of the clock signal CK to provide the power supply voltage to the node ZZ2. The transistor LN4 node is gated to the voltage level of the node ZZ1 to provide a ground voltage, and the transistor LN3 is gated to the inverted voltage level of the node ZZ2 to provide the ground voltage to the node ZZ2.

The output circuit 102a may include a latch having such an arrangement, and when the semiconductor circuit according to various exemplary embodiments includes the output circuit 102a, it can operate as a flip-flop. These contents are similarly applied to other exemplary embodiments to be described below in connection with FIGS. 2 to 12.

Figure 1C:
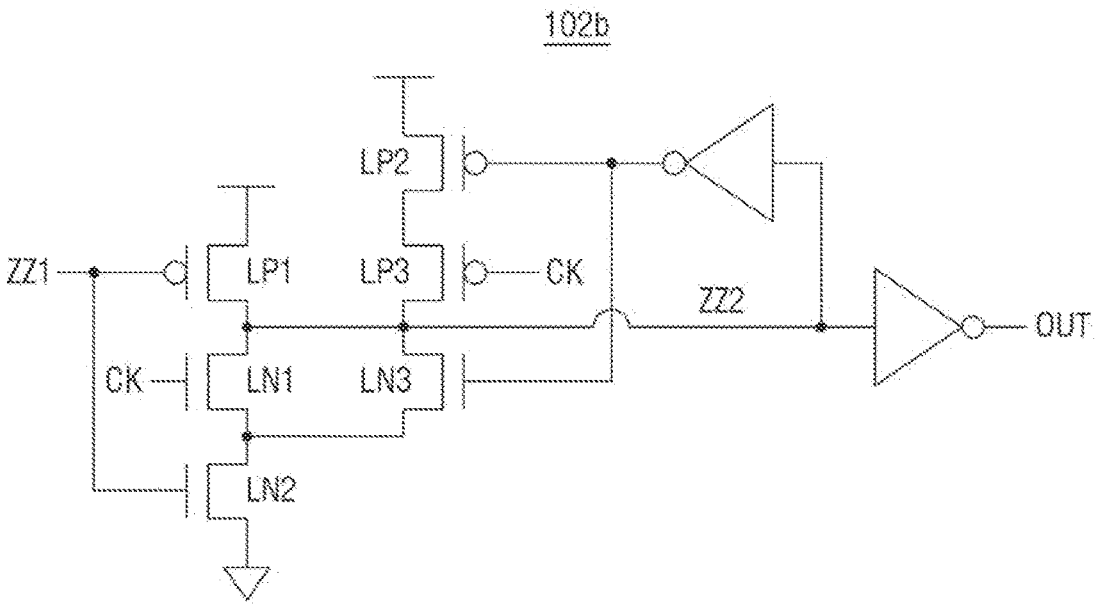
FIG. 1C is a diagram illustrating another modified example of the output circuit of the semiconductor circuit according to an exemplary embodiment.

FIG. 1C illustrates another modified example of the output circuit of the semiconductor circuit according to an exemplary embodiment.

Referring to FIG. 1C, the output circuit 102b may include transistors LP1, LN1, and LN2 connected in series with each other, and transistors LP2, LP3, and LN3 connected in series with each other.

The transistor LP1 is gated to the voltage level of the node ZZ1 to provide the power supply voltage to the node ZZ2, the transistor LN2 is gated to the voltage level of the node ZZ1 to provide a ground voltage, and the transistor LN1 is gated to the voltage level of the clock signal CK to provide the ground voltage to the node ZZ2.

The transistor LP2 is gated to the inverted voltage level of the node ZZ2 to provide the power supply voltage, and the transistor LP3 is gated to the voltage level of the clock signal CK to provide the power supply voltage to the node ZZ2. The transistor LN3 is gated to the inverted voltage level of the node ZZ2 to provide a ground voltage from the transistor LN2 to the node ZZ2.

the output circuit 102b may include the latch having such an arrangement, and when the semiconductor circuit according to various exemplary embodiments includes the output circuit 102b, it can operate as a flip-flop. These contents are similarly applied to other exemplary embodiments to be described below in connection with FIGS. 2 to 12.

Figure 2:
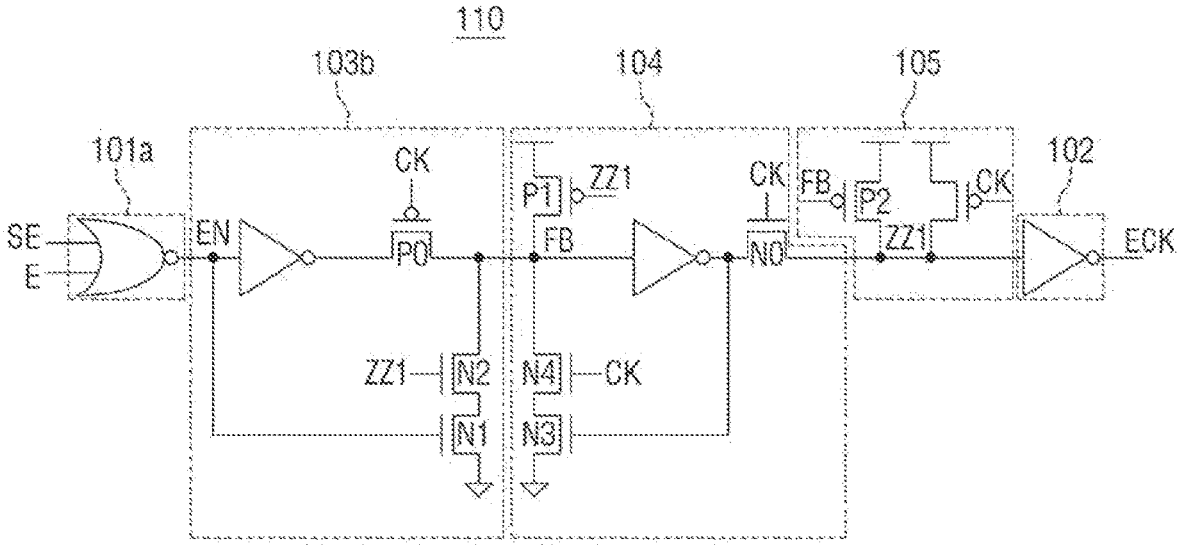
FIG. 2 is a circuit diagram illustrating a semiconductor circuit according to another exemplary embodiment.

FIG. 2 is a circuit diagram illustrating a semiconductor circuit according to another exemplary embodiment.

Referring to FIG. 2, a semiconductor circuit 110 according to the exemplary embodiment may include a first circuit 103b. The first circuit 103b may include a transistor N1 gated to the voltage level of the node EN, a transistor N2 connected in series with the transistor N1 and gated to the voltage level of the node ZZ1, and a transistor P0 connected in series with the transistors N1 and N2 and gated to the voltage level of the clock signal CK. In particular, the transistors N1 and N2 are connected in series with the transistor P0, and a drain of one of the transistors N1 and N2 is connected to the node FB. In some exemplary embodiments, the connection sequence of the transistors N1 and N2 connected in series with each other may be changed.

Figure 3:
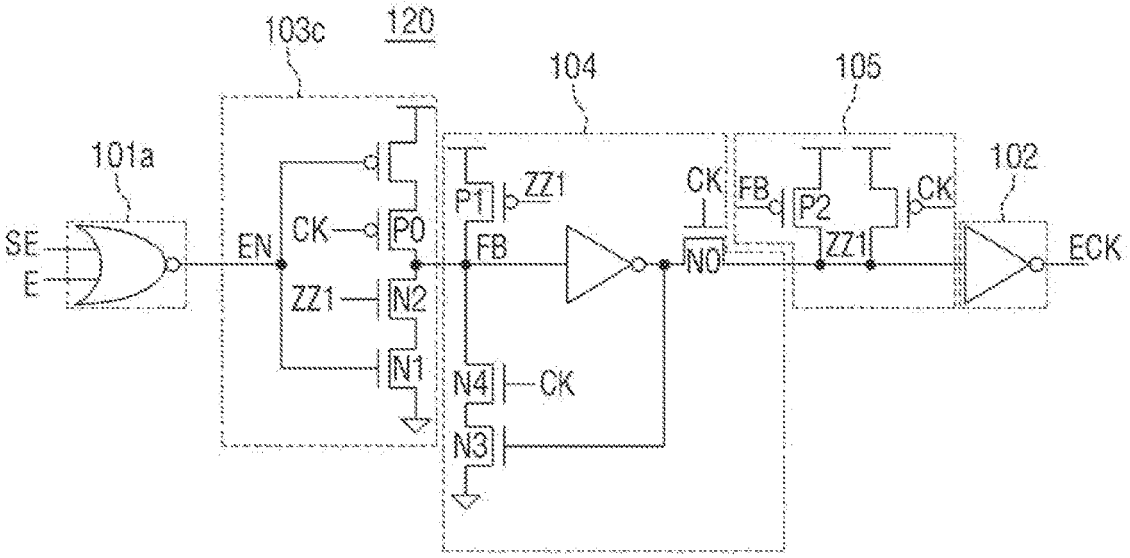
FIG. 3 is a circuit diagram illustrating a semiconductor circuit according to still another exemplary embodiment.

FIG. 3 is a circuit diagram illustrating a semiconductor circuit according to still another exemplary embodiment.

Referring to FIG. 3, a semiconductor circuit 120 according to the exemplary embodiment may include a first circuit 103c. The first circuit 103c may include transistors N1 and N2 connected in series with the transistor P0, and a transistor gated to the voltage level of the node EN to provide a power supply voltage to the node FB and connected in series with the transistor P0. In some exemplary embodiments, the connection sequence of the transistors connected in series with each other may be changed.

Figure 4:
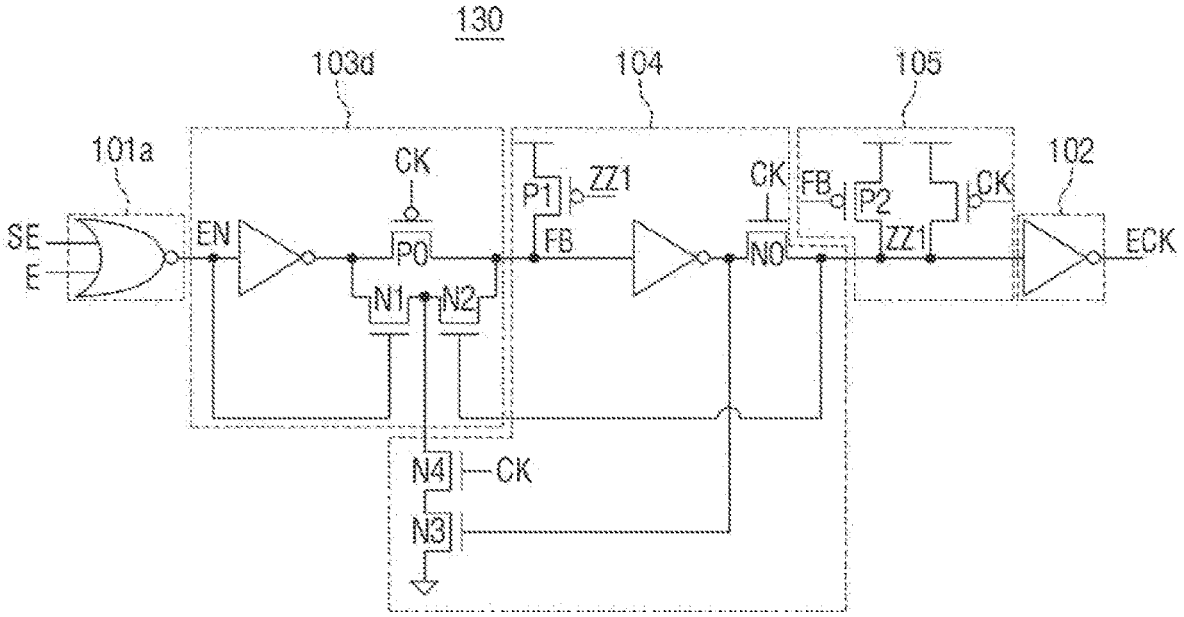
FIG. 4 is a circuit diagram illustrating a semiconductor circuit according to still another exemplary embodiment.

FIG. 4 is a circuit diagram illustrating a semiconductor circuit according to still another exemplary embodiment.

Referring to FIG. 4, a semicondcutor circuit 130 according to the exemplary embodiment may include a first circuit 103d. The first circuit 103d may include a transistor N1 gaged to the voltage level of the node EN, a transistor N2 connected in series with the transistor N1 and gated to the voltage level of the node ZZ1, and a transistor P0 connected in parallel with the transistor N1 and N2 and gated to the voltage level of the clock signal CK. In particular, the transistors N1 and N2 are connected in parallel with the transistor P0, and a source of any one of the transistors N1 and N2 is connected to the node FB.

The second circuit 104 may include a transistor P1 gated to the voltage level of the node ZZ1 to provide the power supply voltage to the node FB, a transistor N3 gated to the inverted voltage level of the node FB to provide a ground voltage, and a transistor N4 connected in series with the transistor N3 and gated to the voltage level of the clock signal CK to provide the ground voltage to the node FB. Here, a drain of the transistor N4 of the second circuit 104 is connected between the transistor N1 and the transistor N2 of the first circuit 103d.

Figure 5:
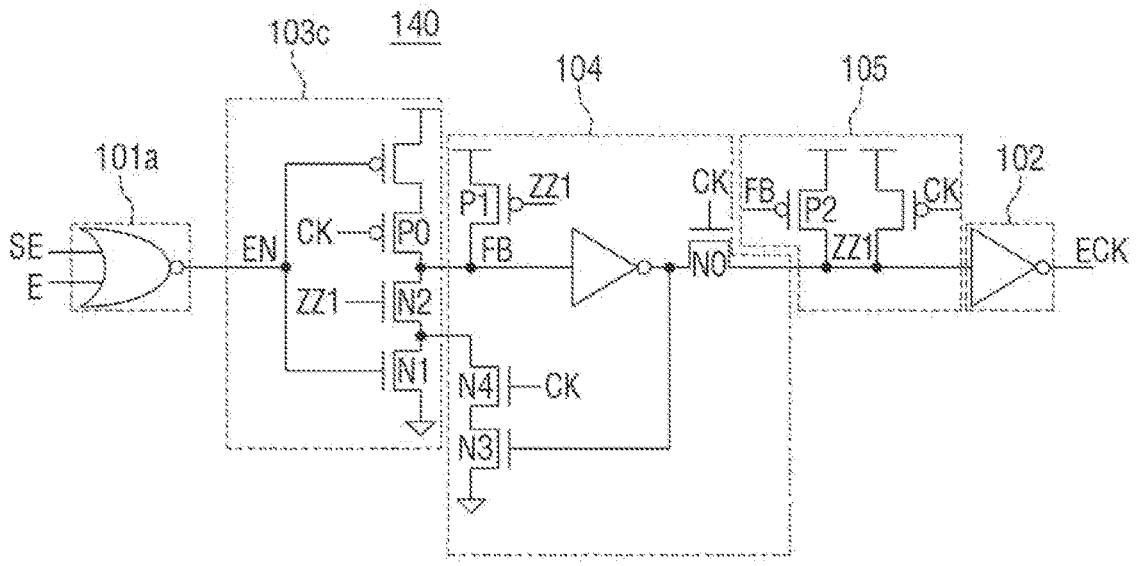
FIG. 5 is a circuit diagram illustrating a semiconductor circuit according to still another exemplary embodiment.

FIG. 5 is a circuit diagram illustrating a semiconductor circuit according to still another exemplary embodiment.

Referring to FIG. 5, a semiconductor circuit 140 according to the exemplary embodiment may include a first circuit 103c. The first circuit 103c may include the transistors N1 and N2 connected in series with the transistor P0, and a transistor gated to the voltage level of the node EN to provide the power supply voltage to the node PB and connected in series with the transistor P0.

The second circuit 104 may include a transistor P1 gated to the voltage level of the node ZZ1 to provide a power supply voltage to the node FB, a transistor N3 gated to the inverted voltage level of the node FB to provide a ground voltage, and a transistor N4 connected in series with the transistor N3 and gated to the voltage level of the clock signal CK to provide the ground voltage to the node FB. Here, a drain of the transistor N4 of the second circuit 104 is connected between the transistor N1 and the second transistor N2 of the first circuit 103d.

Figure 6:
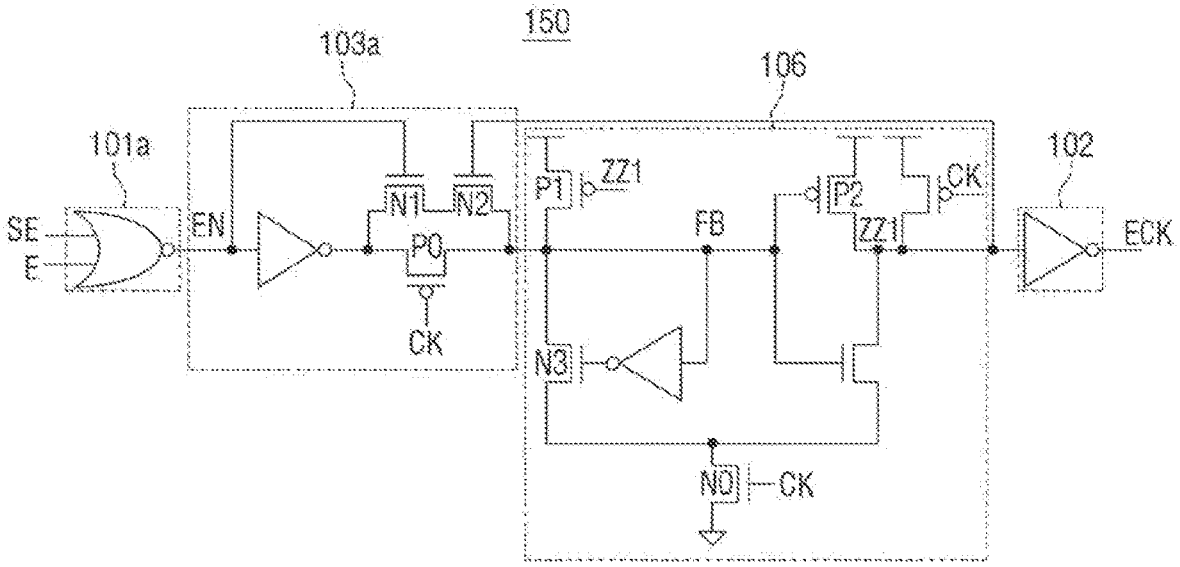
FIG. 6 is a circuit diagram illustrating a semiconductor circuit according to still another exemplary embodiment.

FIG. 6 is a circuit diagram illustrating a semiconductor circuit according to still another exemplary embodiment.

Referring to FIG. 6, a semiconductor circuit 150 according to the exemplary embodiment may include a first circuit 103a, and a fourth circuit 106 corresponding to the second circuit 104 and the third circuit 105 in the above-described embodiments. The first circuit 103a may include a transistor N1 gated to the voltage level of the node EN, a transistor N2 connected in series with the transistor N1 and gated to the voltage level of the node ZZ1, and a transistor P0 connected in parallel with the transistors N1 and N2 and gated to the voltage level of the clock signal CK. In particular, the transistors N1 and N2 are connected in parallel with the transistor P0, and a source of one of the transistors N1 and N2 is connected to the node FB. In some exemplary embodiments, the connection sequence of the transistors N1 and N2 connected in series with each other may be changed.

The fourth circuit 106 may include a transistor P2 gated to the voltage level of the node FB to provide the power supply voltage to the node ZZ1, and a transistor connected in parallel with the transistor P2 and gated to the voltage level of the clock signal CK to provide the power supply voltage to the node ZZ1. Here, the fourth circuit 106 is gated to the voltage level of the node FB and its source is connected to the drain of the transistor N0.

Further, the fourth circuit 106 may include a transistor P1 gated to the voltage level of the node ZZ1 to provide the power supply voltage to the node FB, and a transistors N3 gated to the inverted voltage level of the node FB to provide the ground voltage, and the source of the transistor N3 is connected to the drain of the transistor N0.

Figure 7:
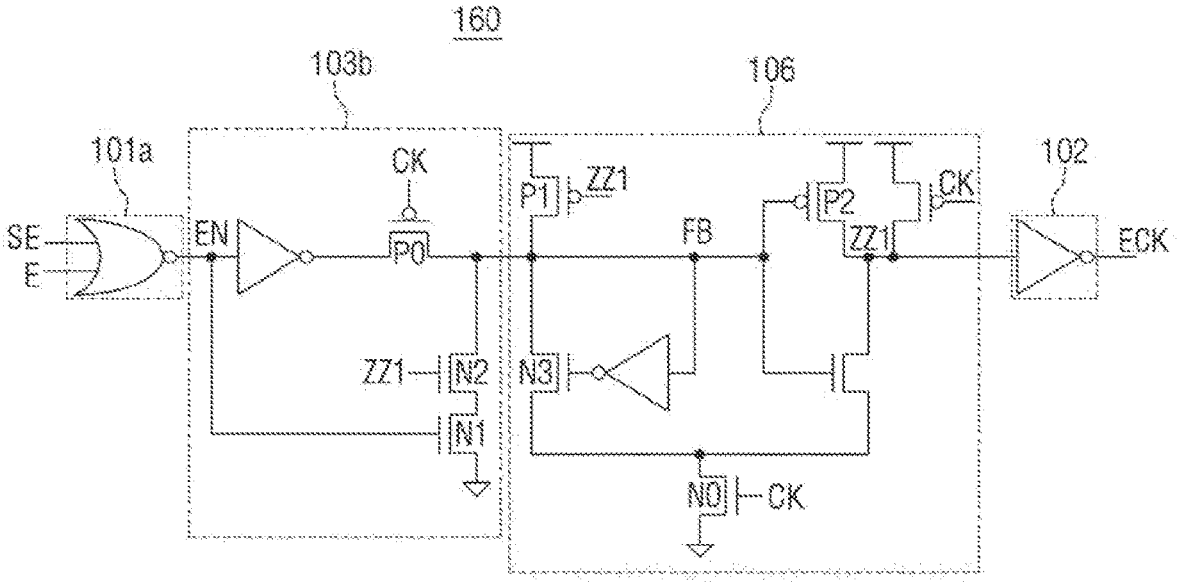
FIG. 7 is a circuit diagram illustrating a semiconductor circuit according to still another exemplary embodiment.

FIG. 7 is a circuit diagram illustrating a semiconductor circuit according to still another exemplary embodiment.

Referring to FIG. 7, unlike the exemplary embodiment of FIG. 6, a semiconductor circuit 160 according to the exemplary embodiment may include a first circuit 103b. The first circuit 103b may include a transistor N1 gated to the voltage level of the node EN, a transistor N2 connected in series with the transistor N1 and gated to the voltage level of the node ZZ1, and a transistor P0 connected in series with the transistors N1 and N2 and gated to the voltage level of the clock signal CK. In particular, the transistors N1 and N2 are connected in series with the transistor P0, and a drain of one of the transistors N1 and N2 is connected to the node FB. In some exemplary embodiments, the connection sequence of the transistors N1 and N2 connected in series with each other may be changed.

Figure 8:
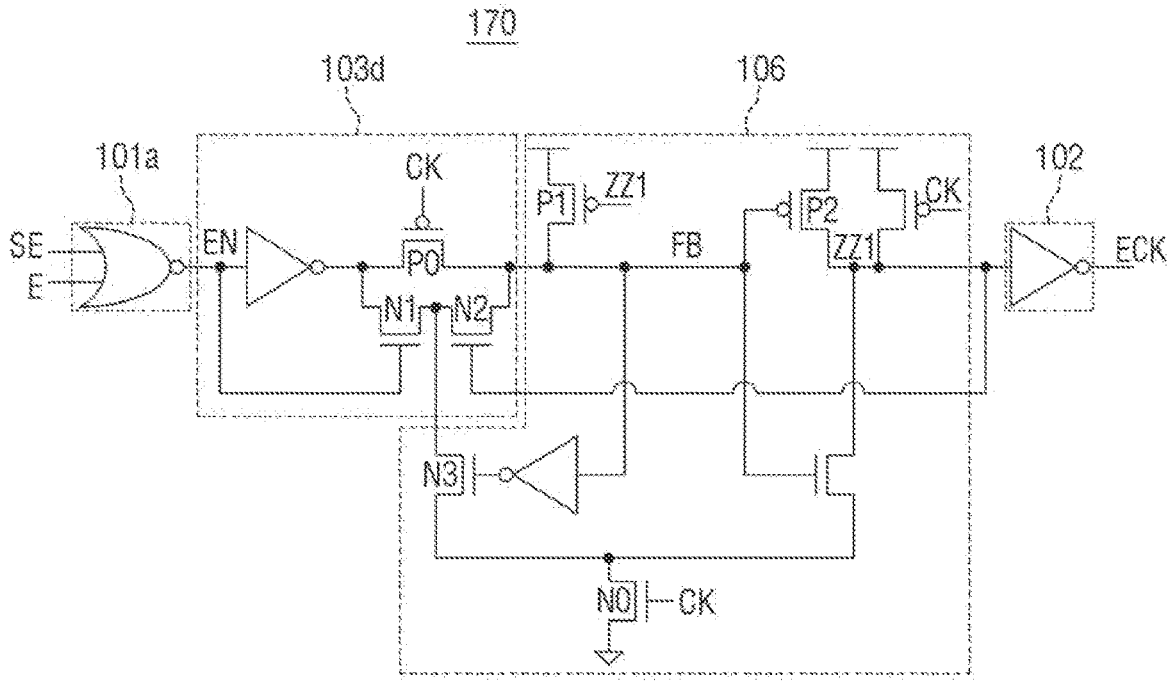
FIG. 8 is a circuit diagram illustrating a semiconductor circuit according to still another exemplary embodiment.

FIG. 8 is a circuit diagram illustrating a semiconductor circuit according to still another exemplary embodiment.

Referring to FIG. 8, unlike the exemplary embodiment of FIG. 6, a semiconductor circuit 170 according to the exemplary embodiment may include a first circuit 103d, and a fourth circuit 106 corresponding to the second circuit 104 and the third the circuit 105 in the above-described embodiments. The first circuit 103d may include a transistor N1 gated to the voltage level of the node EN, a transistor N2 connected in series with the transistor N1 and gated to the voltage level of the node ZZ1, and a transistor P0 connected in parallel with the transistors N1 and N2 and gated to the voltage level of the clock signal CK. In particular, the transistors N1 and N2 are connected in parallel with the transistor P0, and a source of one of the transistors N1 and N2 is connected to the node FB.

The fourth circuit 106 may include a transistor P2 gated to the voltage level of the node FB to provide the power supply voltage to the node ZZ1 and a transistor connected in parallel with a transistor P2 and gated to the voltage level of the clock signal CK to provide the power supply voltage to the node ZZ1. Here, the fourth circuit 106 is gated to the voltage level of the node FB, and its source is connected to the drain of the transistor N0. The fourth circuit 106 may include a transistor P1 gated to the voltage level of the node ZZ1 to provide the power supply voltage to the node FB, and a transistor N3 gated to the inverted voltage level of the node FB to provide the ground voltage, and a source of the transistor N3 is connected to a drain of the transistor N0.

Here, the drain of the transistor N3 is connected between the transistor N1 and the transistor N2.

Figure 9:
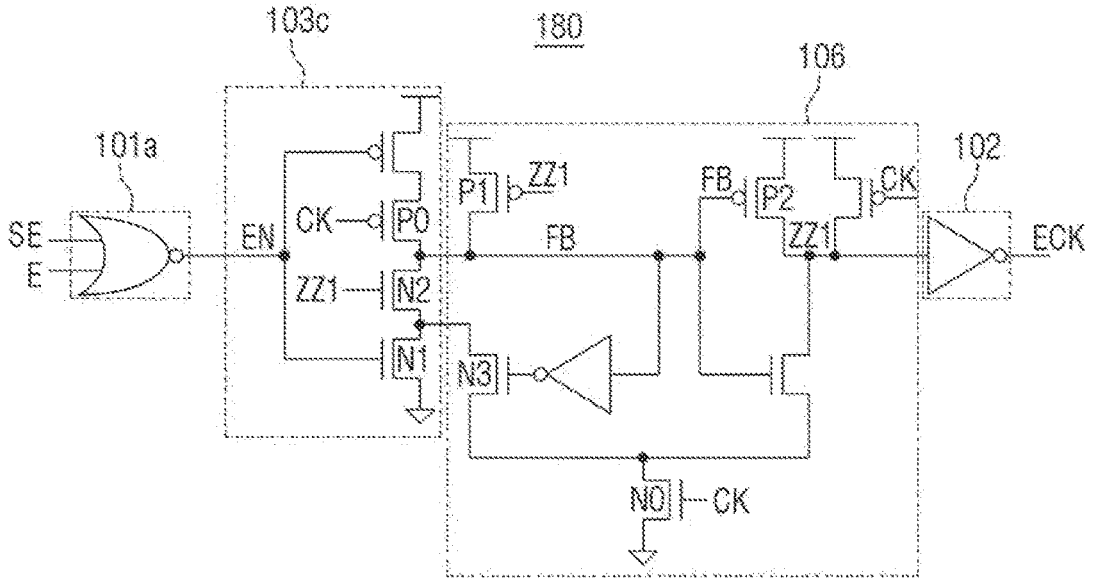
FIG. 9 is a circuit diagram illustrating a semiconductor circuit according to still another exemplary embodiment.

FIG. 9 is a circuit diagram illustrating a semiconductor circuit according to still another exemplary embodiment.

Referring to FIG. 9, unlike the exemplary embodiment of FIG. 6, a semiconductor circuit 180 according to the exemplary embodiment may include a first circuit 103c, and a fourth circuit 106 corresponding to the second circuit 104 and the third and the circuit 105 in the above-described embodiments. The first circuit 103c may include the transistors N1 and N2 connected in series with the transistor P0, and a transistor gated to the voltage level of the node EN to provide the power supply voltage to the node FB and connected in series with the resistor P0.

The fourth circuit 106 may include a transistor P2 gated to the voltage level of the node FB to provide a power supply voltage to the node ZZ1, and a transistor connected in parallel with the transistor P2 and gated to the voltage level of the clock signal CK to provide the power supply voltage to the node ZZ1. Here, the fourth circuit 106 is gated to the voltage level of the node FB, and its source is connected to the drain of the transistor N0. The fourth circuit 106 may include a transistor P1 gated to the voltage level of the node ZZ1 to provide a power supply voltage to the node FB, and a transistor N3 gated to the inverted voltage level of the node FB to provide a ground voltage, and the source of the transistor N3 is connected to the drain of the transistor N0.

Here, the drain of the transistor N3 is connected between the transistor N1 and the transistor N2.

Figure 10:
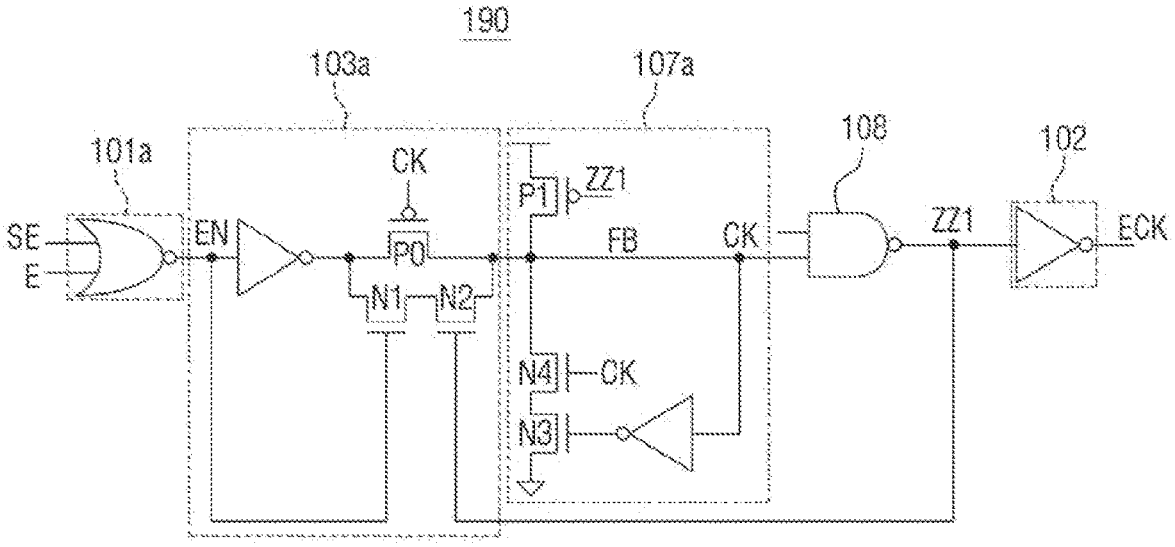
FIG. 10 is a circuit diagram illustrating a semiconductor circuit according to still another exemplary embodiment.

FIG. 10 is a circuit diagram illustrating a semiconductor circuit according to still another exemplary embodiment.

Referring to FIG. 10, a semicondcutor circuit 190 according to the exemplary embodiment may include a first circuit 103a, a firth circuit 107a and an NAND gate 108. The first circuit 103a may include a transistor N1 gated to the voltage level of the node EN, a transistor N2 connected in series with the transistor N1 and gated to the voltage level of the node ZZ1, and a transistor P0 connected in parallel with the transistor N1 and N2 and gated to the voltage level of the clock signal CK. In particular, the transistors N1 and N2 are connected in parallel with the transistor P0, and a source of FB. In some exemplary embodiments, the connection sequence of the transistors N1 and N2 connected in series with each other may be changed.

The fifth circuit 107a may include a transistor P1 gated to the voltage level of the node ZZ1 to provide the power supply voltage to the node FB, a transistor N3 gated to the inverted voltage level of the node FB to provide the ground voltage, and a transistor N4 connected in series with the transistor N3 and gated to the voltage level of the clock signal CK to provide the ground voltage to the node FB. In some exemplary embodiments, the connection sequence of the transistors N3 and N3 connected in series with each other may be changed.

The NAND gate 108 determines the voltage level of the node ZZ1, by setting the voltage level of the clock signal CK and the voltage level of the node FB as a first input, and a second input, respectively.

Figure 11:
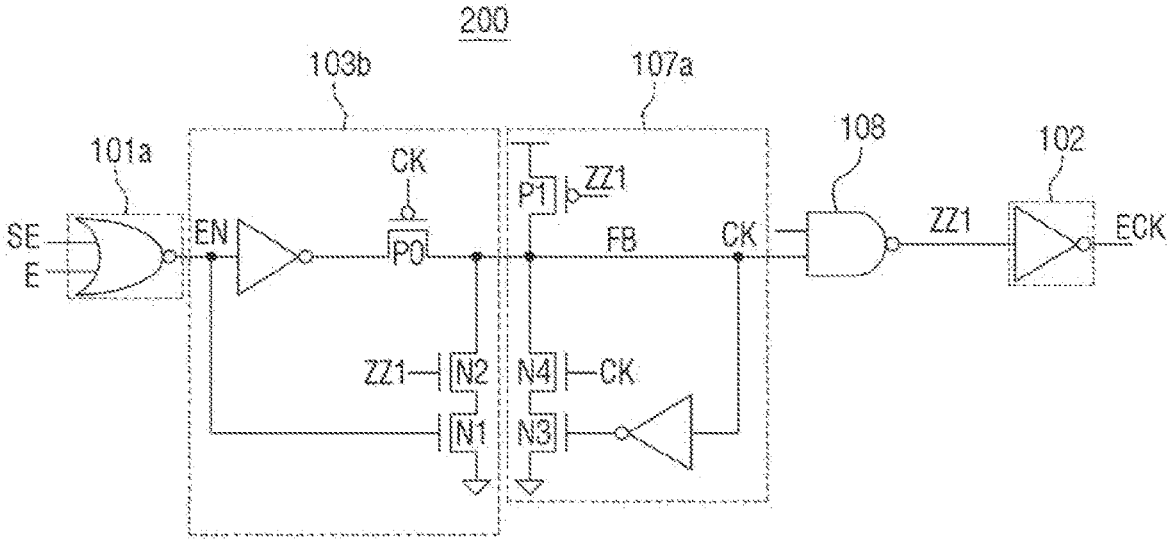
FIG. 11 is a circuit diagram illustrating a semiconductor circuit according to still another exemplary embodiment.

FIG. 11 is a circuit diagram illustrating a semiconductor circuit according to still another exemplary embodiment.

Referring to FIG. 11, unlike the exemplary embodiment of FIG. 10, the semiconductor circuit 200 according to the exemplary embodiment may include a first circuit 103b. The first circuit 103b may include a transistor N1 gated to the voltage level of the EN, a transistor N2 connected in series with the transistor N1 and gated to the voltage level of the node ZZ1, and a transistor P0 connected in series with the transistors N1 and N2 and gated to the voltage level of the clock signal CK. In particular, the transistors N1 and N2 are connected in series with the transistor P0, and a drain of one of the transistors N1 and N2 is connected to the node FB. In some exemplary embodiments, the connection sequence of the transistors N1 and N2 connected in series with each other may be changed.

Figure 12:
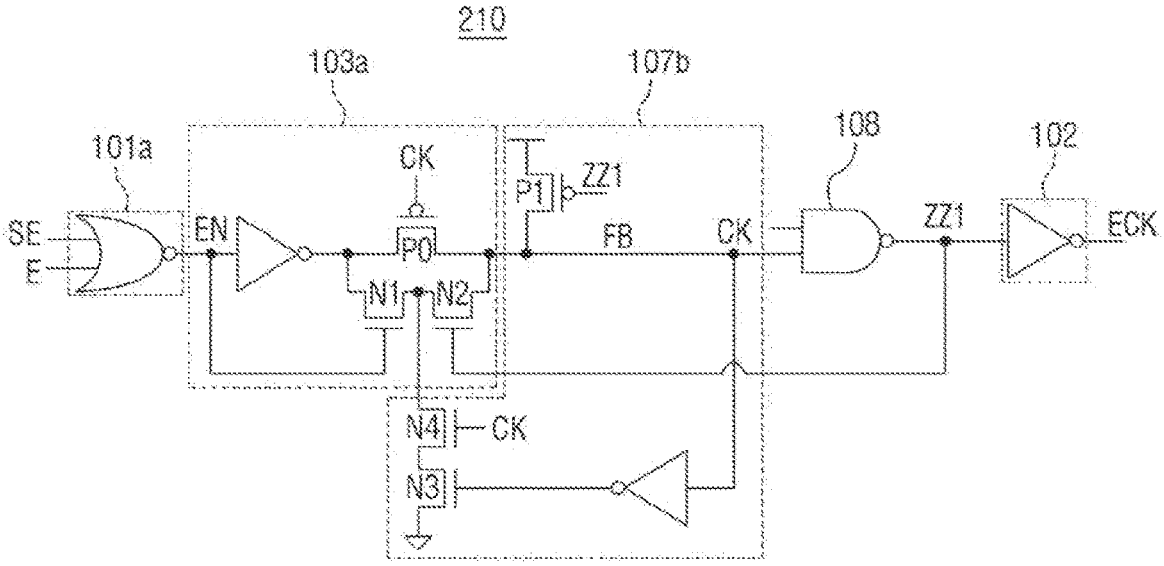
FIG. 12 is a circuit diagram illustrating a semiconductor circuit according to still another exemplary embodiment.

FIG. 12 is a circuit diagram illustrating a semiconductor circuit according to still another exemplary embodiment.

Referring to FIG. 12, unlike the exemplary embodiment of FIG. 10, a semiconductor circuit 200 according to the exemplary embodiment may include a fifth circuit 107b. The fifth circuit 107b may include a transistor P1 gated to the voltage level of the node ZZ1 to provide the power supply voltage to the node FB, a transistor N3 gated to the inverted voltage level of the node FB to provide the ground voltage, and a transistor N4 connected in series with the transistor N3 and gated to the voltage level of the clock signal CK to provide the ground voltage to the node FB.

Here, the drain of the transistor N4 of the fifth circuit 107b is connected between the transistor N1 and the transistor N2 of the first circuit 103a.

Figure 13:
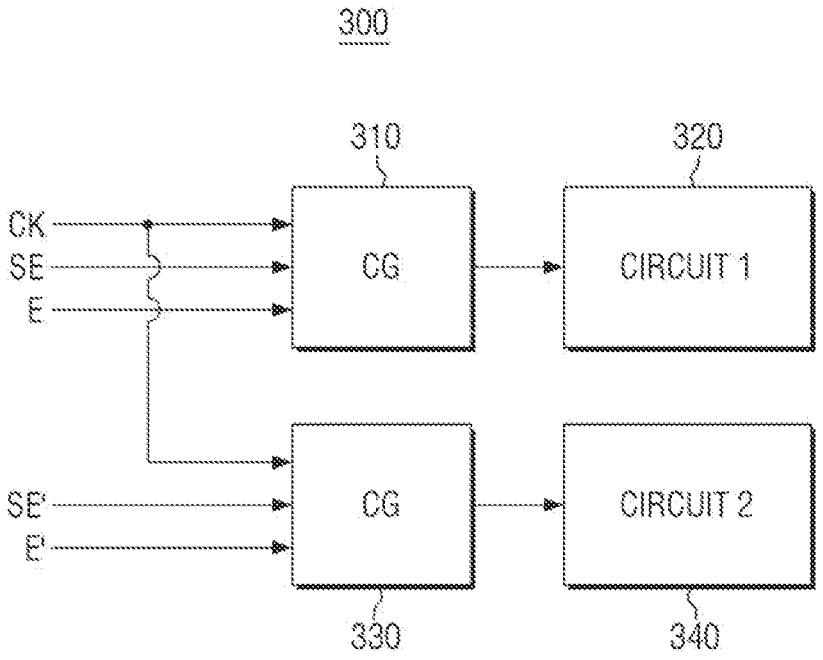
FIG. 13 is a circuit diagram illustrating a semiconductor circuit according to still another exemplary embodiment.

FIG. 13 is a circuit diagram illustrating a semiconductor circuit according to an exemplary embodiment.

Referring to FIG. 13, a semiconductor circuit 300 according to an exemplary embodiment may include a clock signal CK, a first clock gate circuit 310 and a second clock gate circuit 330 each including a first circuit and a second circuit, a first operation circuit 320 that receives the clock signal CK through the first clock gate circuit 310, and a second operating circuit 340 that receives the clock signal CK through the second clock gate circuit 330.

The first circuit may include a transistor P0 that inverts the voltage level of the node EN and propagates it to the node FB, when the clock signal CK is at the first voltage level L. The second circuit may include a transistor N0 that inverts the voltage level of the node FB if the clock signal CK is at the second voltage level H and propagates it to the node ZZ1, when the clock signal CK is at the first voltage level L. In some exemplary embodiments, the first circuit and the second circuit may further include a transistor P2 gated to the voltage level of the node FB to provide the power supply voltage to the node ZZ1, when the clock signal CK is transferred from the first voltage level L to the second voltage level H.

The first clock gate circuit 310 may receive an enable signal (E) and a scan enable signal (SE), and the second clock gate circuit 330 may receive an enable signal (E') and a scan enable signal (SE'). The first clock gate circuit 310 receiving the enable signal (E) of the first voltage level L may provide a signal of a first voltage level L to the first operation circuit 320 by utilizing the transistor P0 and the transistor N0. The second clock gate circuit 330 receiving the enable signal (E') of the second voltage level H may transmit the clock signal CK to the second operation circuit 340 by utilizing the transistor P0 and the transistor N0.

For example, in the first clock gate circuit 310, when the clock signal CK is at the first voltage level L, the transistor P0 is turned on, and the node FB has the first voltage level L, and when the clock signal CK is at the second voltage level H, the transistor P0 is turned off and the first voltage level L is maintained at the node FB, the transistor N0 is turned on, the first node ZZ1 may receive the power supply voltage by the third transistor P2.

In the second clock gate circuit 330, when the clock signal CK is at the first voltage level L, the transistor P0 is turned on, and the node FB has the second voltage level H, and when the clock signal CK is at the second voltage level H, the transistor P0 is turned off and the second voltage level H is maintained at the node FB, the transistor N0 is turned on, the second voltage level H of the node FB is inverted and it is propagated to the node ZZ1. When the clock signal CK is at the first voltage level L, the node ZZ1 may receive the power supply voltage by a transistor gated to the voltage level of the clock signal CK.

Figure 14:
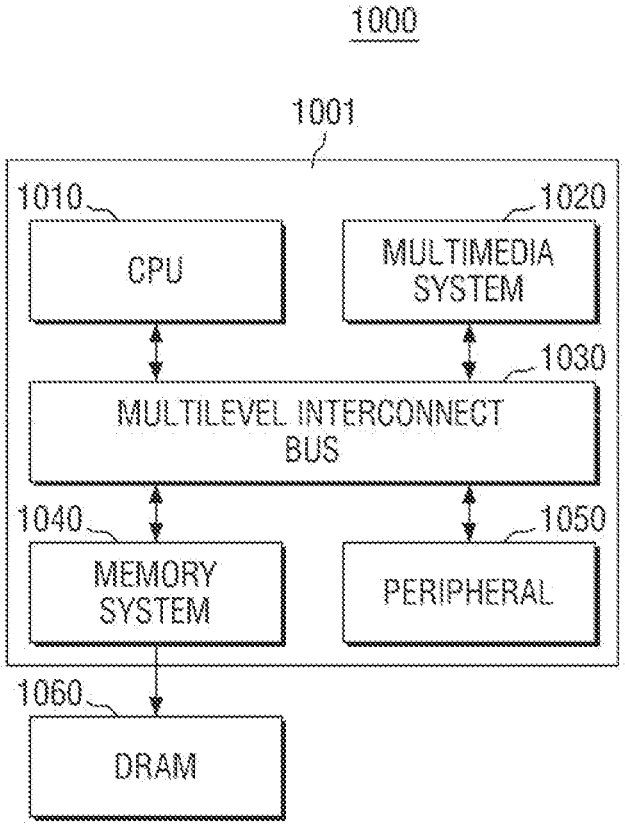
FIG. 14 is a block diagram of a SoC system including the semiconductor circuit according to the above exemplary embodiments.

FIG. 14 is a block diagram of a system on chip (SoC) system including a semiconductor circuit according to an exemplary embodiment.

Referring to FIG. 14, the SoC system 1000 may include an application processor 1001 and a dynamic random access memory (DRAM) 1060.

The application processor 1001 may include a central processing unit (CPU) 1010, a multimedia system 1020, a bus 1030, a memory system 1040 and a peripheral circuit 1050.

the CPU 1010 may perform operations required for driving the SoC system 1000. In some exemplary embodiments, the CPU 1010 may be constituted by a multi-core environment that includes the multiple cores.

The multimedia system 1020 may be used to perform various multimedia functions in the SoC system 1000. The multi-media system 1020 may include a 3D engine module, a video codec, a display system, a camera system, a post-processor and the like.

The bus 1030 may be used to perform mutual data communication of the CPU 1010, the multimedia system 1020, the memory system 1040 and the peripheral circuit 1050. In some exemplary embodiments, the bus 1030 may have a multilayer structure. Specifically, as an example of the bus 1030, but not limited thereto, a multilayer advanced high-performance bus (AHB), or a multilayer advanced extensible interface (AXI) may be used.

The memory system 1040 may provide an environment needed for the application processor 1001 to be connected to an external memory (e.g., the DRAM 1060) and operate at high speed. In some exemplary embodiments, the memory system 1040 may include a separate controller (e.g., a DRAM controller) needed to control the external memory (e.g., the DRAM 1060).

The peripheral circuit 1050 may provide an environment needed for the SoC system 1000 to smoothly connect to an external device (e.g., a mainboard). Accordingly, the peripheral circuit 1050 may include various interfaces that enable the external device connected to the SoC system 1000 to be compatible with the SoC system 1000.

The DRAM 1060 may function as an operating memory needed for the operation of the application processor 1001. In some exemplary embodiments, the DRAM 1060 may be disposed outside the application processor 1001. Specifically, the DRAM 1060 may be packaged with the application processor 1001 in the form of package on package (PoP).

The semiconductor circuits according to the aforementioned embodiments may be adopted as one component of the SoC system 1000.

Figure 15:
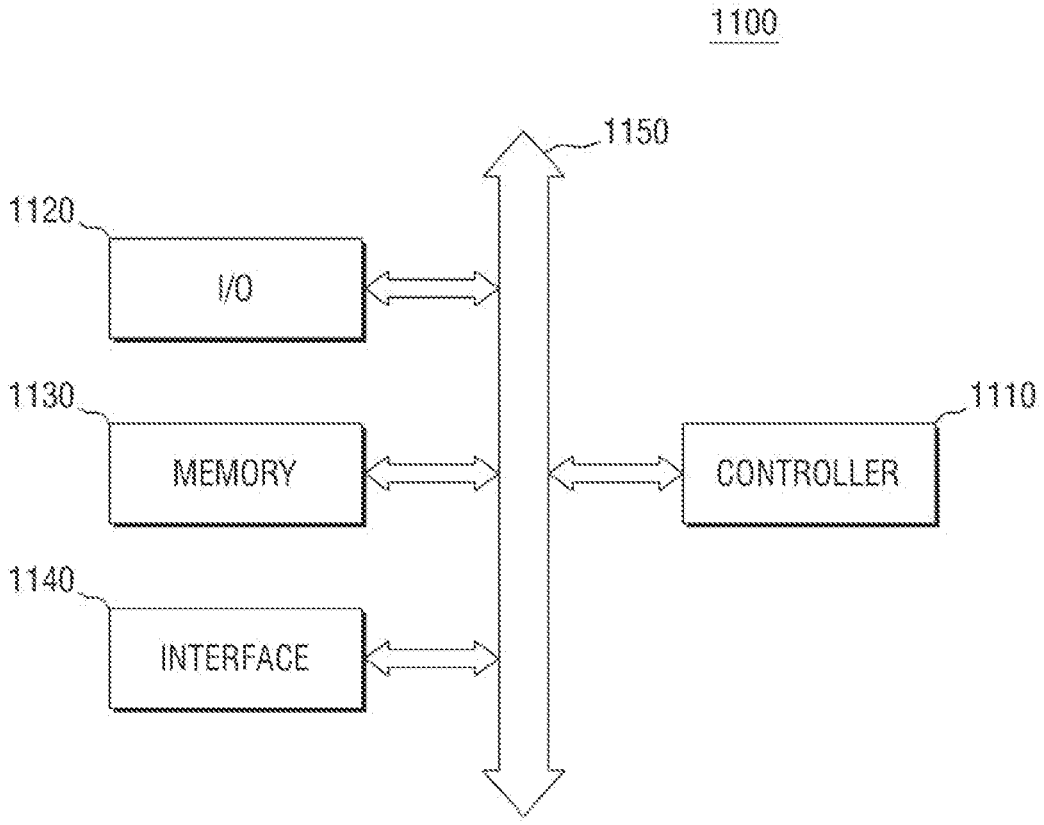
FIG. 15 is a block diagram of an electronic system including the semiconductor circuit according to the above exemplary embodiments.

FIG. 15 is a block diagram illustrating an electronic system including semiconductor circuit according to the aforementioned embodiments.

Referring to FIG. 15, the electronic system 1100 according to the exemplary embodiment may include a controller 1110, an input/output (I/O) device 1120, a memory device 1130, an interface 1140 and a bus 1150. The controller 1110, the I/O device 1120, the memory device 1130 and/or the interface 1140 may be connected to one another through the bus 1150. The bus 1150 corresponds to a path through which the data are moved.

The controller 1110 may include at least one of a microprocessor, a digital signal processor, a microcontroller and logic devices capable of performing similar functions to the elements. The I/O device 1120 may include a keypad, a keyboard, a display device and the like. The memory device 1130 may store data and/or commands. The interface 1140 may serve to transmit data to or receive data from a communication network. The interface 1140 may be a wired or wireless interface. The interface 1140 may include an antenna or a wired or wireless transceiver.

Although not shown in the drawing, the electronic system 1100 may be an operating memory for improving the operation of the controller 1110, and include a high-speed DRAM or SRAM.

The electronic system 1100 may be applied to all types of electronic products capable of transmitting or receiving information in a wireless environment, such as a personal digital assistant (PDA), a portable computer, a web tablet, a wireless phone, a mobile phone, a digital music player and a memory card.

Any one of the semiconductor circuits according to the aforementioned exemplary embodiments may be provided as at least one of the consistent elements of the electronic system 1100.

Figure 16:
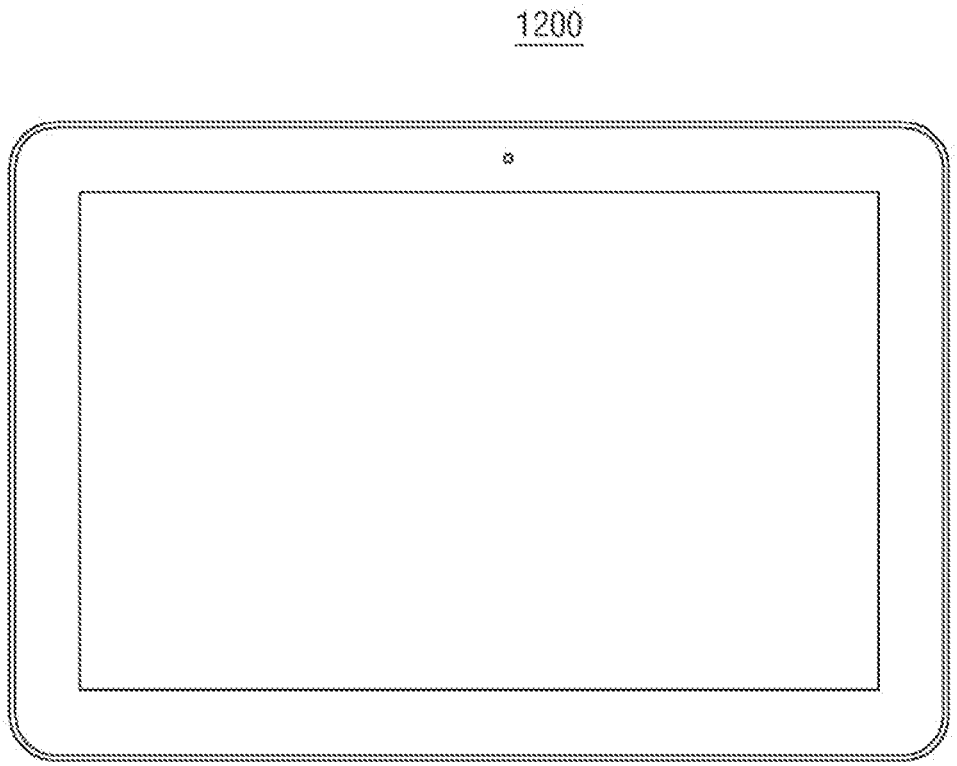
FIGS. 16 to 18 are exemplary semiconductor systems to which the semiconductor circuits according to some exemplary embodiments are applicable.
Figure 17:
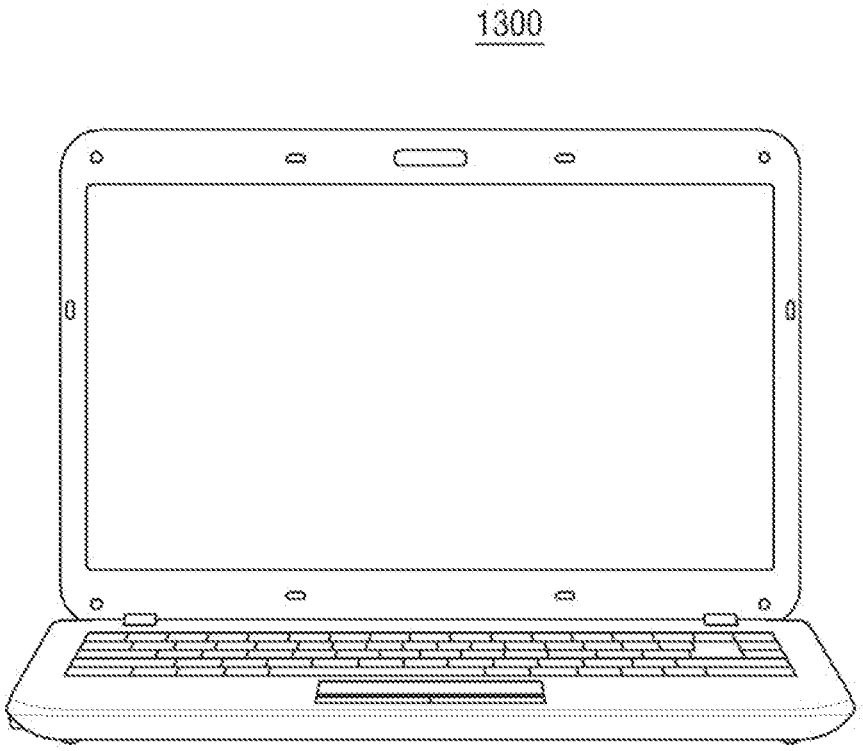
Figure 18:
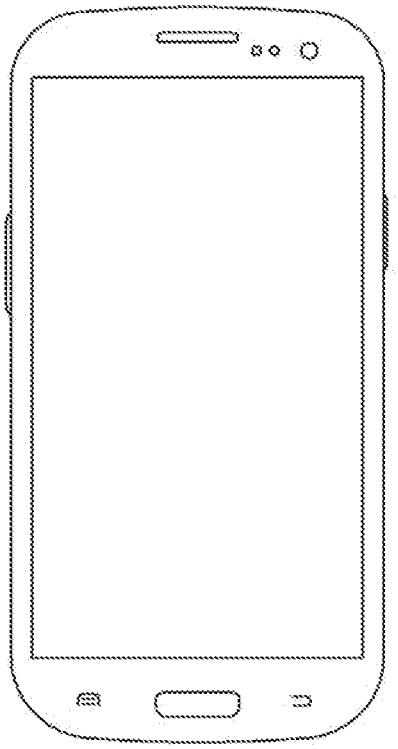

FIGS. 16 through 18 are diagrams illustrating examples of a semiconductor system to which the semiconductor circuit according to some exemplary embodiments can be applied.

FIG. 16 illustrates a tablet personal computer (PC) 1200, FIG. 17 illustrates a notebook computer 1300, and FIG. 18 illustrates a smart phone 1400. The semiconductor circuits according to the aforementioned exemplary embodiments may be used in the tablet PC 1200, the notebook computer 1300, and the smart phone 1400.

Further, it is obvious to a person skilled in the art that the semiconductor circuits according to some exemplary embodiments may also be applied to other KC devices other than those set forth herein. That is, while the table PC 120, the notebook computer 1300, and the smart phone 1400 have been described above as examples of a semiconductor system according to this embodiment, the examples of the semiconductor system according to the embodiment are not limited thereto. In some exemplary embodiments, the semiconductor system may be provided as a computer, an Ultra Mobile PC (UMPC), a work station, a net-book computer, a personal digital assistant (PDA), a portable computer, a wireless phone, a mobile phone, an e-book, a portable multimedia player (PMP), a portable game console, a navigation device, a black box, a digital camera, a 3-dimensional television set, a digital audio recorder, a digital audio player, a digital picture recorder, a digital picture player, a digital vide recorder, a digital video player, etc.

While the inventive concept has been particularly illustrated and described with reference to exemplary embodiments thereof, it will be understood by those of ordinary skill in the art that various changes in form and detail may be made therein without departing from the spirit and scope of the inventive concept as defined by the following claims. The exemplary embodiments should be considered in a descriptive sense only and not for purposes of limitation.

What is claimed is:

1. A semiconductor circuit comprising:

an input circuit configured to determine a voltage level of a first node;

a first circuit configured to propagate a value of the first node to a second node based on a voltage level of a clock signal;

a second circuit configured to propagate a value of the second node to a third node *and determine a value of the third node* based on the voltage level of the [clock signal;

a third circuit configured to determine a value of the third node based on a voltage level of the second node and the voltage level of the clock signal; and] *second node and the voltage level of the clock signal; and* an output circuit configured to determine a voltage level of a fourth node based on a voltage level of the third node, wherein the first circuit includes a first transistor gated to the voltage level of the first node, a second transistor gated to the voltage level of the third node, and a third transistor gated to the voltage level [of the] of the clock signal,

*wherein the first transistor is connected with the second transistor in series,*

*wherein one of a source or a drain of the first transistor is connected to an input from the first node, and* wherein the second circuit includes *an inverter inverting the second node,* a fourth transistor gated to [the voltage level of the clock signal, and wherein a source terminal of the first transistor is connected to an input from the first node] *output of the inverter, and a fifth transistor gated to the clock signal and connected with the fourth transistor.*

[2. The semiconductor circuit of claim 1, wherein when the first node is at a first voltage level and the clock signal is at the first voltage level, the first transistor is turned on and the second node is at a second voltage level.]

[3. The semiconductor circuit of claim 1, wherein when the first node is at a first voltage level and the clock signal is at a second voltage level, the first transistor is turned off and the voltage level of the second node is maintained.]

[4. The semiconductor circuit of claim 1, wherein when the clock signal is at a first voltage level, the third node receives a power supply voltage.]

[5. The semiconductor circuit of claim 1, wherein the output circuit includes an inverter configured to invert the voltage level of the third node.]

[6. The semiconductor circuit of claim 1, wherein the third transistor is connected in parallel with the first and second transistors.]

[7. The semiconductor circuit of claim 1, wherein the second transistor is connected in series with the first transistor, and the third transistor is connected in parallel with the first and second transistors.]

[8. The semiconductor circuit of claim 1, wherein the source terminal of the first transistor is connected to the first node through an inverter.]

9. A semiconductor circuit comprising:

an input circuit configured to determine a voltage level of a first node;

a first circuit configured to [propagate a value of the first node to a second node based on a voltage level of a clock signal] *determine a voltage level of a second node based on the first node*;

a second circuit configured to propagate a value of the second node to a third node *and determine a value of the third node* based on the voltage level of the [clock signal;

a third circuit configured to determine a value of the third node based on a voltage level of the second node and the voltage level of the clock signal; and] *second node and a voltage level of a clock signal;* an output circuit configured to determine a voltage level of a fourth node based on a voltage level of the third node, wherein the first circuit includes a first transistor gated to the voltage level of the first node, a second transistor gated to the voltage level of the third node, and a third transistor gated to the voltage level of the of the clock signal, *wherein the first transistor is connected in series with the second transistor,* wherein the second circuit includes *an inverter inverting the second node and* a fourth transistor gated to [the voltage level of the clock signal, and wherein the second transistor is connected in series with the first transistor, and the third transistor is connected in parallel with the first and second transistors] *output of the inverter,*

*wherein the third transistor is connected in parallel with the first and second transistors.*

[10. A semiconductor circuit comprising:

a first circuit including a first transistor configured to propagate an inverted voltage level of a first node to a second node when a clock signal is at a first voltage level;

a second circuit including a second transistor configured to propagate an inverted voltage level of the second node to a third node when the clock signal is at a second voltage level; and a third circuit including a third transistor gated to a voltage level of the second node and configured to provide a power supply voltage to the third node, wherein a source terminal of the first transistor is connected to an input from the first node.]

[11. The semiconductor circuit of claim 10, wherein the first circuit includes a fourth transistor and a fifth transistor.]

[12. The semiconductor circuit of claim 11, wherein the fourth transistor is connected in parallel with the first transistor.]

[13. The semiconductor circuit of claim 10, wherein when the first node is at the first voltage level and the clock signal is at the first voltage level, the first transistor is turned on and the second node is at the second voltage level.]

[14. The semiconductor circuit of claim 10, wherein when the first node is at the first voltage level and the clock signal is at the second voltage level, the first transistor is turned off and a voltage level of the second node is maintained.]

[15. The semiconductor circuit of claim 10, wherein when the clock signal is at the first voltage level, the third node receives the power supply voltage.]

[16. The semiconductor circuit of claim 10, wherein the third transistor provides the power supply voltage to the third mode when the clock signal is changed from the first voltage level to the second voltage level.]

[17. The semiconductor circuit of claim 10, wherein the source terminal of the first transistor is connected to the first mode through an inverter.]

*18. The semiconductor circuit of claim 1, wherein the second circuit comprises a sixth transistor gated to the voltage level of the second node to provide a power supply voltage to the third node, and a seventh transistor connected in parallel with the sixth transistor and gated to the voltage level of the clock signal to provide the power supply voltage to the third node.*

*19. The semiconductor circuit of claim 1, wherein the third transistor is connected in parallel with the first and second transistors.*

*20. The semiconductor circuit of claim 19, wherein a drain of the fourth transistor is connected with a drain of the first transistor and the drain of the fourth transistor is connected with a source of the second transistor,*

*wherein a source of the first transistor is connected to an input from the first node and a drain of the second transistor is connected to the second node.*

*21. The semiconductor circuit of claim 1, wherein a drain of the second transistor and the drain of a third transistor are connected to the second node.*

*22. The semiconductor circuit of claim 1, wherein the semiconductor circuit further comprising,*

*a NAND gate conducting a NAND logical operation with the clock signal and the voltage level of the second node,*

*wherein the NAND gate is connected between the second circuit and the output circuit.*

*23. The semiconductor circuit of claim 1, wherein a source of the fourth transistor is connected to a ground and a drain of the fourth transistor is connected to a source of the fifth transistor.*

*24. The semiconductor circuit of claim 9, wherein the second circuit includes a fifth transistor gated to the clock signal,*

*wherein the fifth transistor is connected in series with the fourth transistor, and a source of the fourth transistor is connected with ground.*

*25. The semiconductor circuit of claim 24, wherein a drain of the fifth transistor is connected with the second node.*

*26. The semiconductor circuit of claim 24, wherein a drain of the fifth transistor is connected with the drain of the first transistor and a source of the second transistor.*

*27. The semiconductor circuit of claim 9, wherein a drain of the fourth transistor is connected with a drain of the first transistor and a source of the second transistor, and a source of the fourth transistor is connected with a drain of a sixth transistor.*

*28. The semiconductor circuit of claim 9, wherein the input circuit comprises a NOR gate.*

*29. The semiconductor circuit of claim 9, wherein the second circuit comprises a sixth transistor gated to the clock signal and connected with the inverter and the third node.*

*30. The semiconductor circuit of claim 9, wherein the second circuit comprises a sixth transistor gated to the clock signal and connected with the fourth transistor.*

* * * * *